United States Patent
Kim et al.

(10) Patent No.: US 11,205,639 B2
(45) Date of Patent: Dec. 21, 2021

(54) INTEGRATED CIRCUIT DEVICE WITH STACKED DIES HAVING MIRRORED CIRCUITRY

(71) Applicant: XILINX, INC., San Jose, CA (US)

(72) Inventors: Myongseob Kim, Pleasanton, CA (US); Henley Liu, San Jose, CA (US); Cheang Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/798,267

(22) Filed: Feb. 21, 2020

(65) Prior Publication Data
US 2021/0265312 A1   Aug. 26, 2021

(51) Int. Cl.
*H01L 21/50* (2006.01)
*H01L 25/065* (2006.01)
*H01L 25/00* (2006.01)

(52) U.S. Cl.
CPC .......... *H01L 25/0657* (2013.01); *H01L 21/50* (2013.01); *H01L 25/50* (2013.01)

(58) Field of Classification Search
CPC ............................................ H01L 2224/48227
See application file for complete search history.

(56) References Cited

U.S. PATENT DOCUMENTS

| | | | | |
|---|---|---|---|---|
| 8,546,955 | B1* | 10/2013 | Wu | H01L 25/0652 257/777 |
| 9,337,138 | B1* | 5/2016 | Abugharbieh | H01L 23/5223 |
| 9,349,707 | B1* | 5/2016 | Sun | H01L 25/0652 |
| 10,692,837 | B1* | 6/2020 | Kim | H01L 25/0652 |
| 2013/0049216 | A1* | 2/2013 | Lin | H01L 25/50 257/774 |
| 2015/0214191 | A1* | 7/2015 | Lee | H01L 21/563 257/712 |
| 2017/0365584 | A1* | 12/2017 | Vadhavkar | H01L 23/373 |
| 2020/0303343 | A1* | 9/2020 | Manipatruni | H01L 23/525 |

* cited by examiner

*Primary Examiner* — Thao P Le
(74) *Attorney, Agent, or Firm* — Patterson + Sheridan, LLP

(57) ABSTRACT

An integrated circuit device and techniques for manufacturing the same are described therein. The integrated circuit device leverages two or more pairs of stacked integrated circuit dies that are fabricated in mirror images to reduce the complexity of manufacturing, thus reducing cost. In one example, an integrated circuit device is provided that includes an integrated circuit (IC) die stack. The IC die stack includes first, second, third and fourth IC dies. The first and second IC dies are coupled by their active sides and include arrangements of integrated circuitry that are mirror images of each other. The third and fourth IC dies are also coupled by their active sides and include arrangements of integrated circuitry that are mirror images of each other.

20 Claims, 7 Drawing Sheets

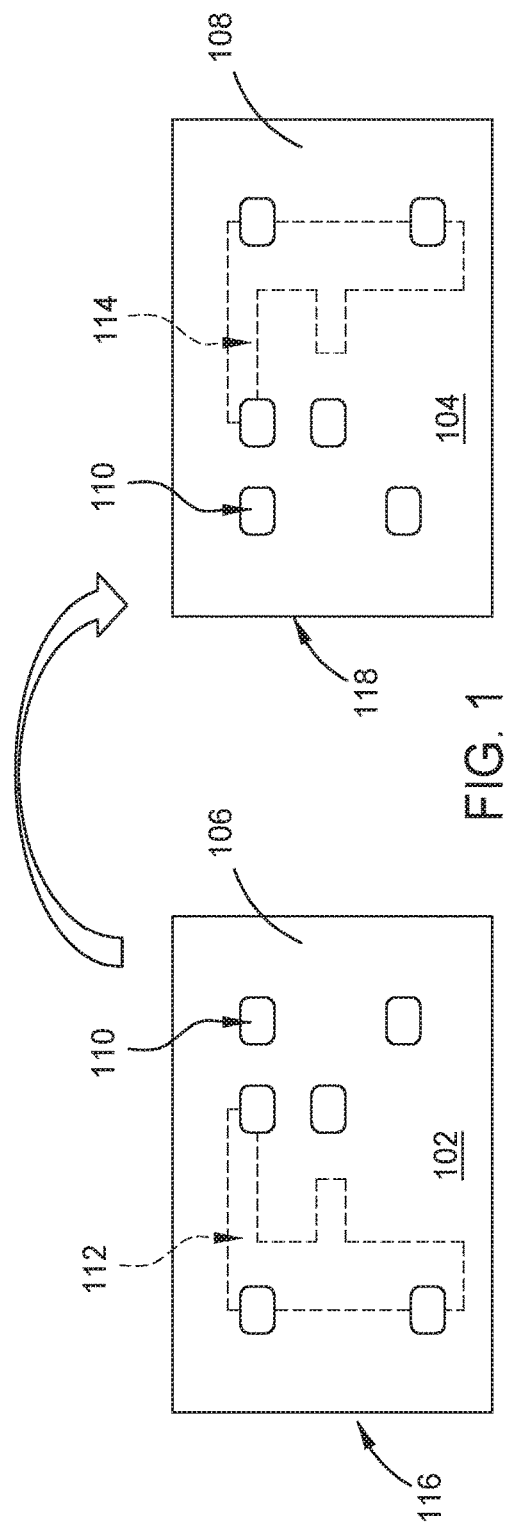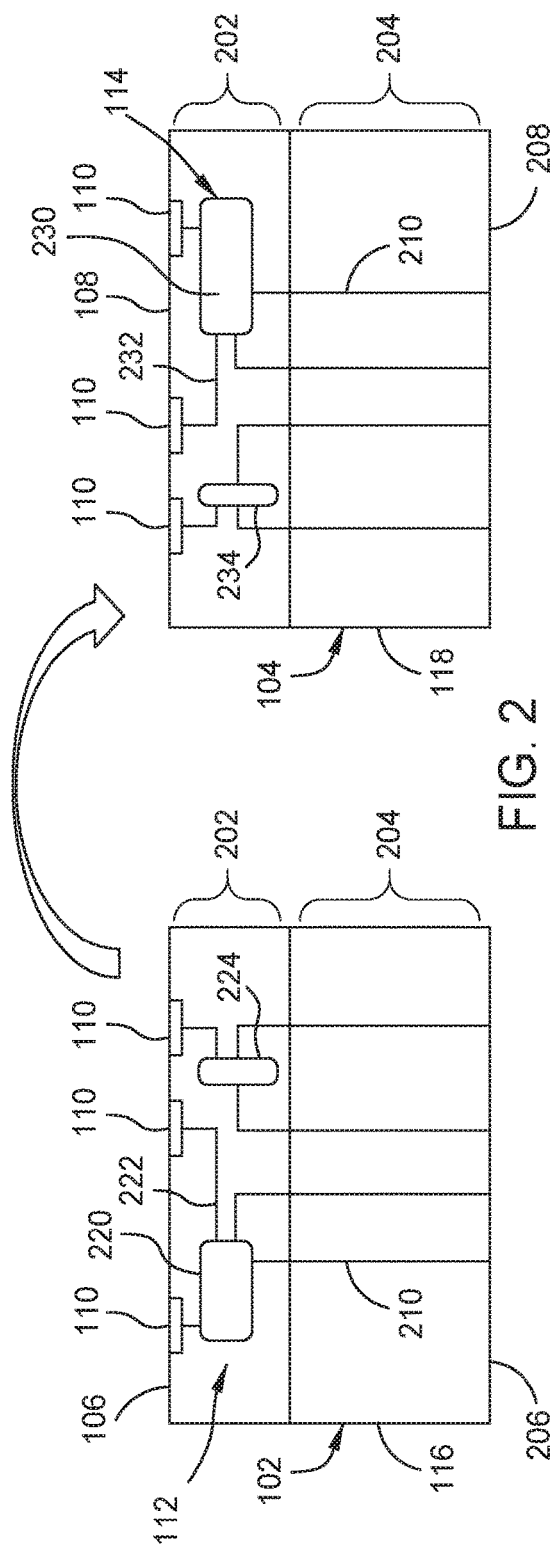

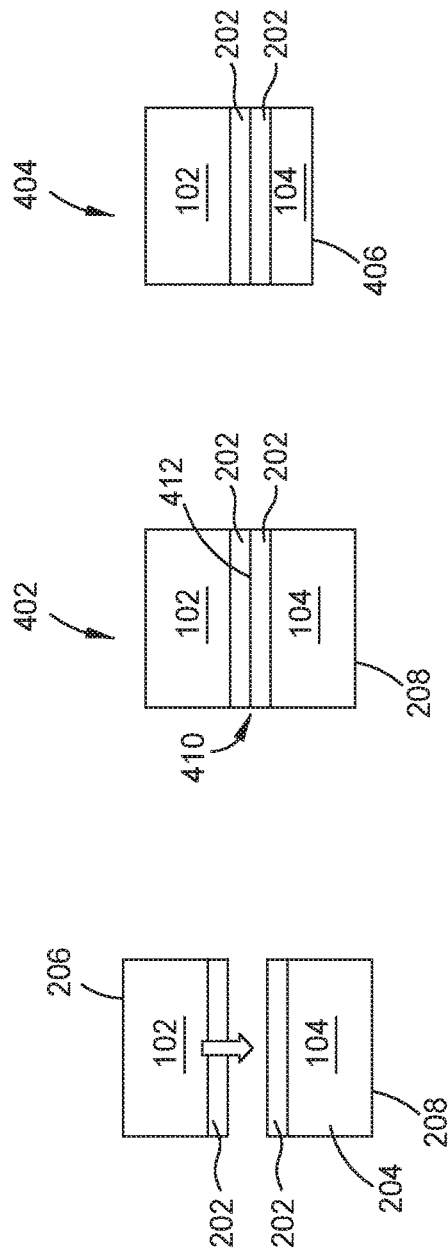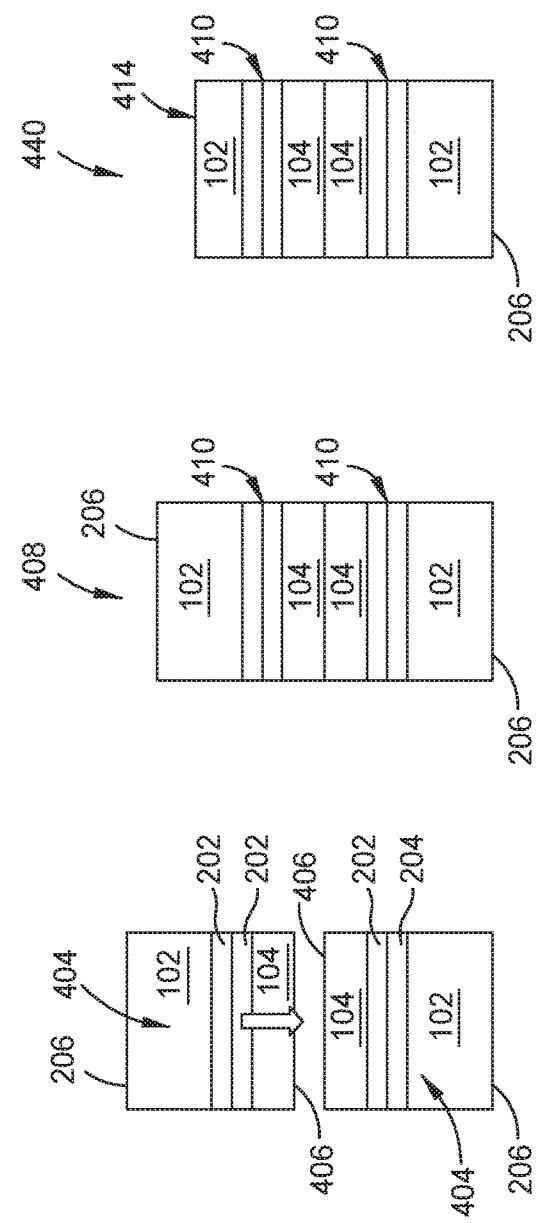

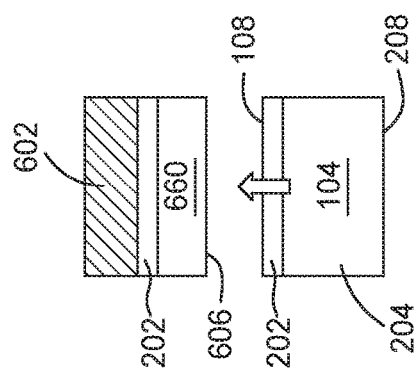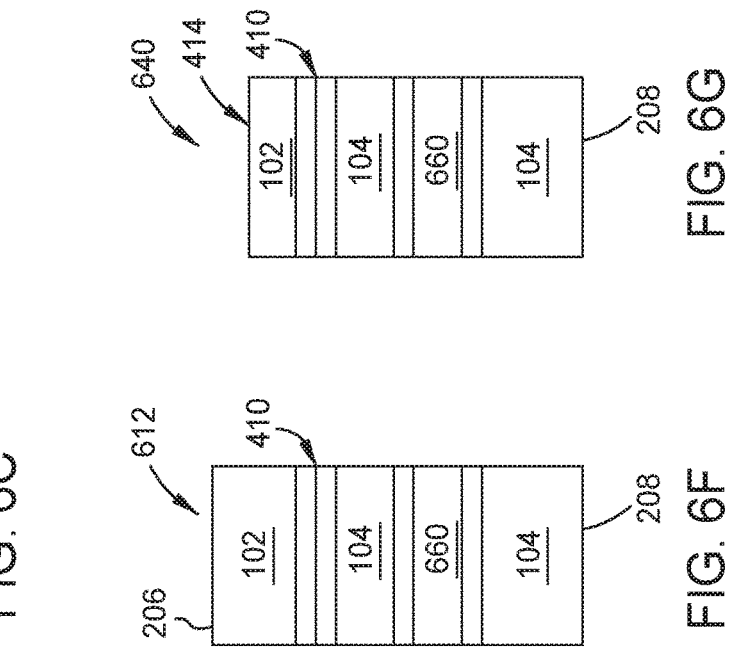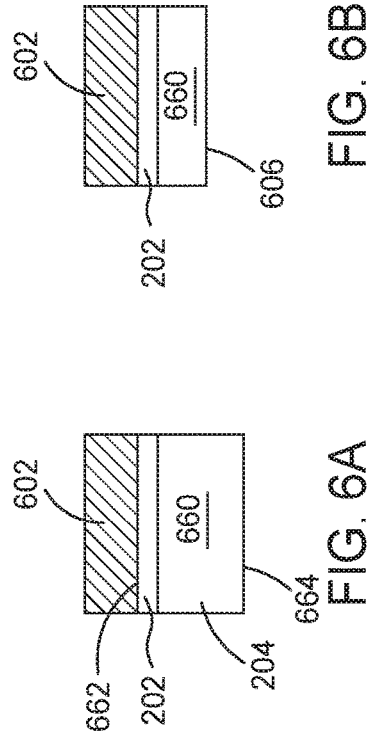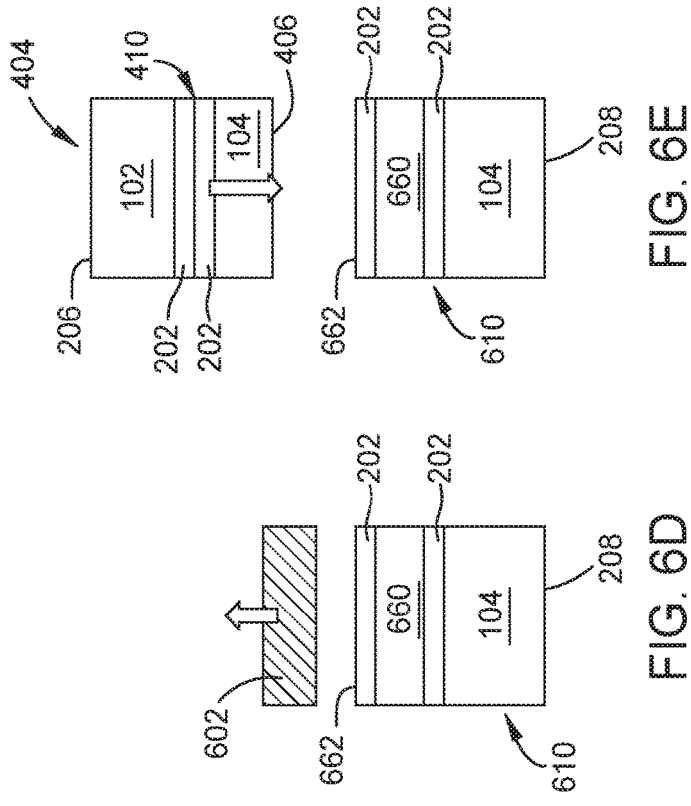

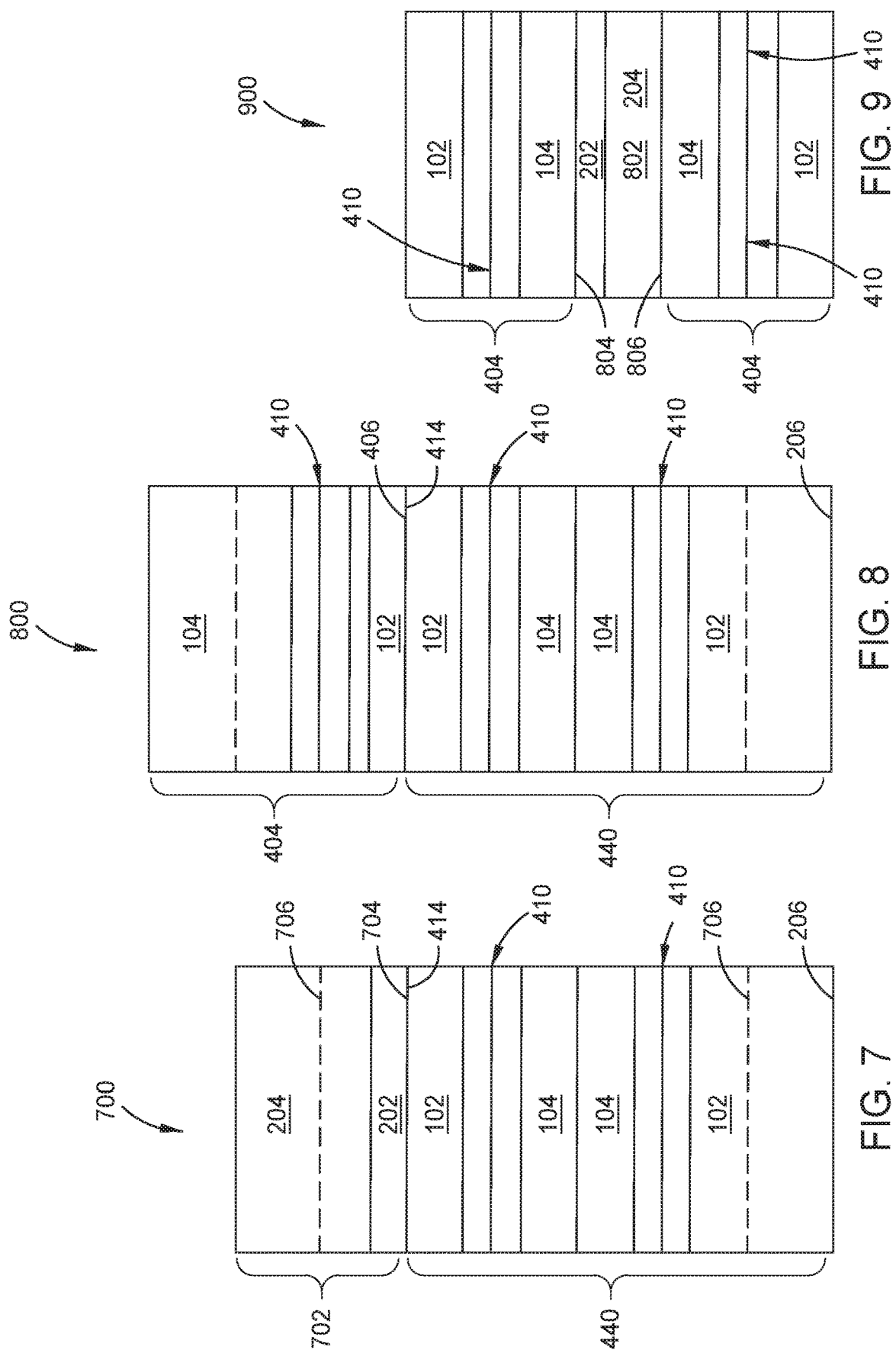

INTEGRATED CIRCUIT DEVICE WITH STACKED DIES HAVING MIRRORED CIRCUITRY

TECHNICAL FIELD

Embodiments of the present invention generally relate to integrated circuit devices, and more particularly, to an integrated circuit devices having stacked integrated circuit dies with mirrored circuitry and methods for fabricating the same.

BACKGROUND

Electronic devices often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices. These electronic devices containing one or more chip packages are frequently utilized in advanced electronic computing systems, such as found in telecomm and datacomm equipment, data centers and automotive electronics, among others.

In many chip package assemblies, the IC dies are stacked to provide increased memory or processing capabilities within a single chip package assembly. Although stacking IC dies is desirable for the increased memory or processing capabilities, stacking IC dies during the manufacture of stacked integrated circuit devices presents additional fabrication complexity, challenges and consequently cost.

Therefore, a need exists for an integrated circuit device that is more cost effective to manufacture as compared to conventions techniques.

SUMMARY

An integrated circuit device and techniques for manufacturing the same are described therein. The integrated circuit device leverages two or more pairs of stacked integrated circuit dies that are fabricated in mirror images to reduce the complexity of manufacturing, thus reducing cost. In one example, an integrated circuit device is provided that includes an integrated circuit (IC) die stack. The IC die stack includes first, second, third and fourth IC dies. The first and second IC dies are coupled by their active sides and include arrangements of integrated circuitry that are mirror images of each other. The third and fourth IC dies are also coupled by their active sides and include arrangements of integrated circuitry that are mirror images of each other.

In another example, an integrated circuit device is provided that includes an integrated circuit (IC) die stack. The IC die stack includes first, second, third and fourth IC dies. The first and second IC dies are coupled by their active sides and include arrangements of integrated circuitry that are mirror images of each other. An active side of the third die body is coupled to a substrate side of the second IC die. An active side of the fourth die body is coupled to a substrate side of the third IC die.

In yet another example, a method for fabricating an integrated circuit device is provided. The method includes mounting an active side of a first integrated circuit (IC) die to an active side of a second IC die, the first and second IC dies having an arrangement of integrated circuitry that are mirror images; and mounting a third IC die to a substrate side of the second IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic top view of two integrated circuit (IC) dies having mirror image circuitry prior to stacking one on top of the other.

FIG. 2 is a schematic sectional view of the IC dies of FIG. 1.

FIGS. 4A-4G are schematic side views of another example of an integrated circuit device during different stages of fabrication according to the method of FIG. 3.

FIGS. 6A-6H are schematic side views of another example of an integrated circuit device during different stages of fabrication according to the method of FIG. 5.

FIGS. 7-9 are schematic side views of various alternative examples of integrated circuit devices that include the IC dies having mirror image circuitry of FIG. 1, among others.

To facilitate understanding, identical reference numerals have been used, where possible, to designate identical elements that are common to the figures. It is contemplated that elements of one embodiment may be beneficially incorporated in other embodiments.

DETAILED DESCRIPTION

Figure 3:
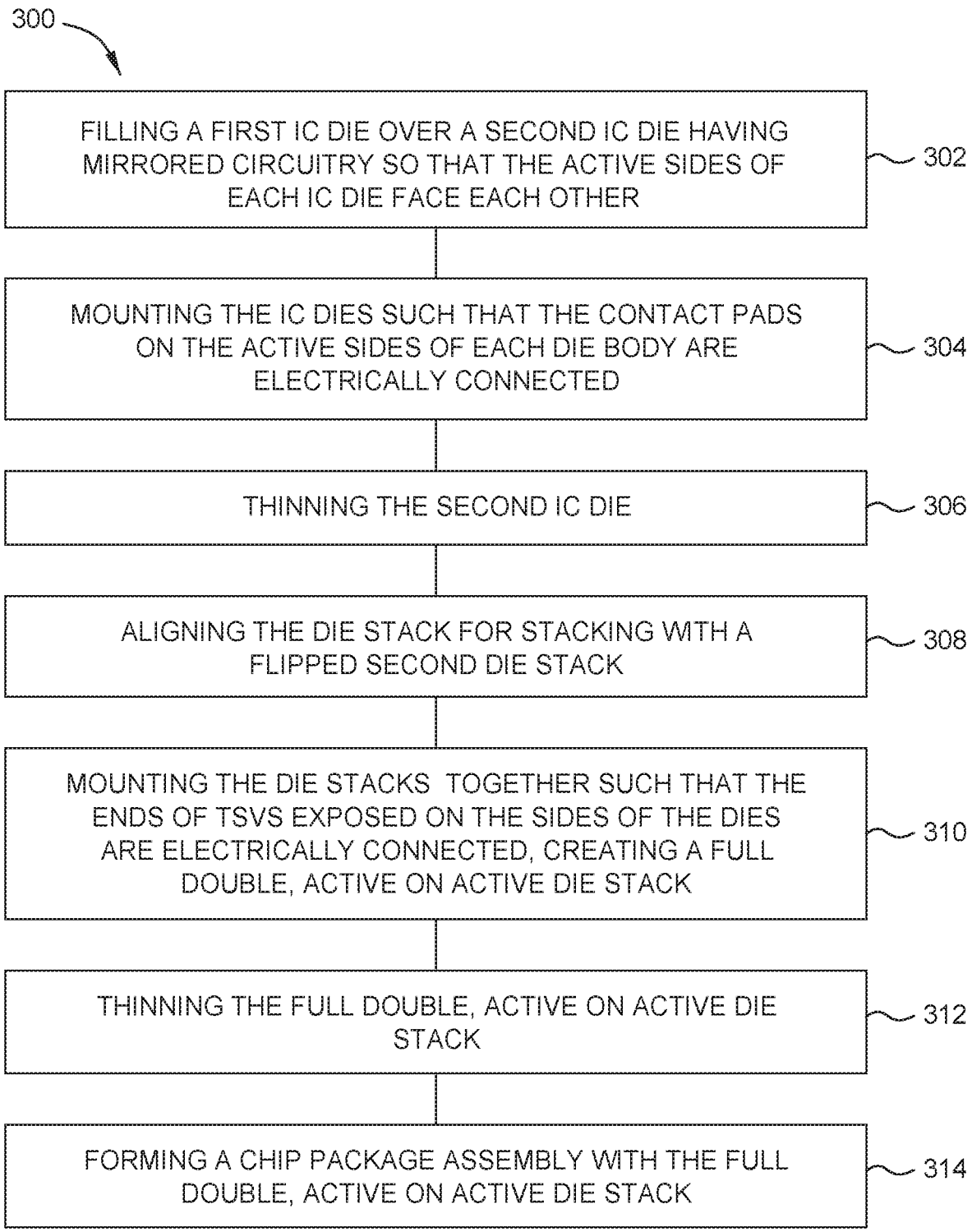
FIG. 3 is a block diagram of a method for fabricating an integrated circuit device that includes the IC dies illustrated in FIG. 1, among others.

An integrated circuit device and techniques for manufacturing the same are described therein. The integrated circuit device leverages two or more pairs of stacked integrated circuit dies that are fabricated in mirror images to reduce the complexity of manufacturing. The use of IC dies having circuitry formed in mirror images allow for a single mask set to be developed and qualified, while a mirror image of that mask set be utilized to produce a second IC die without the extra cost and time needed to developing a different second mask set for the second IC die. Furthermore, the pair of mirrored, stacked integrated circuit dies allows fabrication of a die stack of four of more IC dies to be produced with a reduced number of carrier attach and detach operations during device fabrication. Thus, the cost and time needed for fabrication of the integrated circuit device is further reduced. Accordingly, robust integrated circuit devices are realized that have significant cost and time to production advantages over conventional design and fabrication techniques.

Turning now to FIG. 1, a schematic top view of two integrated circuit (IC) dies 102, 104 are illustrated prior to stacking one on top of the other while fabricating an integrated circuit (IC) device. The IC dies 102, 104 utilized in the IC device may be configured as, but are not limited to, programmable logic devices, such as field programmable gate arrays (FPGA), application-specific integrated circuit (ASIC), memory devices, such as high band-width memory (HBM), optical devices, processors or other IC memory or logic structures. One or more of the IC dies 102, 104 may optionally include optical devices such as photo-detectors, lasers, optical sources, and the like.

The first IC die 102 has a die body 116 containing functional and other circuitry 112. The circuitry 112 is schematically represented by an "F" shown in phantom in FIG. 1. The circuitry 112 terminates on an active side 106 of the die body 116 at a plurality of contact pads 110. Although only 6 contact pads 110 are shown in FIG. 1 for simplicity, in excess of 400 contact pads 110 may be exposed on the active side 106 of the die body 116.

Similarly, the second IC die 104 has a die body 118 containing functional and other circuitry 114. The circuitry 114 is schematically represented by an "ꟻ" shown in phantom in FIG. 1. The circuitry 114 terminates on an active side 108 of the die body 118 at a plurality of contact pads 110. Although only 6 contact pads 110 are shown in FIG. 1 for simplicity, in excess of 400 contact pads 110 may be exposed on the active side 108 of the die body 118.

The circuitry 112 of the first IC die 102 has a first arrangement that is the mirror image of a second arrangement of the circuitry 114 of the second IC die 104. For example, the contact pads 110 of the first IC die 102 are arranged in locations that are a mirror image of the locations of the contact pads 110 of the second IC die 104. The mirrored arrangement of the circuitries 112, 114 of the first and second IC dies 102, 104 are further illustrated in the schematic sectional view of the IC dies 102, 104 of FIG. 2.

As shown in FIG. 2, the circuitry 112 of the first IC die 102 is formed through an active region 202 and a substrate 204 comprising the die body 116. The active region 202 is formed on the substrate 204 and terminates at the active side 106 of the die body 116. A back side 206 of the substrate 204 is disposed on a side of the substrate 204 opposite the active region 202 and faces away from the active side 106.

The active region 202 includes metal and dielectric layers formed in the front end of the line (FEOL) and back end of the line (BEOL) regions of the die body 116. A portion of the circuitry 112 disposed in the active region 202 has an arrangement of circuit elements 220, 224 and routings 222. Two circuit elements 220, 224 illustrated in FIG. 2 are representative of the many, many circuit elements comprising the function portion of the circuitry 112. The circuit elements 220, 224 may include, but are not limited to, any one or more of transistors, diodes, resistors, capacitors, inductors, and memory cells, among others. The circuit elements 220, 224 are interconnect to each other and to the contact pads 110 disposed on the active side 106 of the die body 116 by the routing 222. The routing 222 generally includes conductive lines and vias configured to carrier ground, power or data signals.

A portion of the circuitry 112 includes through silicon vias (TSVs) 210 formed through the substrate 204. One end of the TSVs 210 are exposed on the back side 206 of the die body 116, while the other end of the TSVs 210 are coupled to the circuit elements 220, 224 and the contact pads 110 by the routing 222.

Similarly, the circuitry 114 of the second IC die 104 is formed through an active region 202 and a substrate 204 comprising the die body 118. The active region 202 is formed on the substrate 204 and terminates at the active side 106 of the die body 118. A back side 208 of the substrate 204 is disposed on a side of the substrate 204 opposite the active region 202 and faces away from the active side 106.

A portion of the circuitry 114 disposed in the active region 202 has an arrangement of circuit elements 230, 234 and routings 232. Two circuit elements 230, 234 illustrated in FIG. 2 are representative of the many, many circuit elements comprising the function portion of the circuitry 114. The circuit elements 230, 234 may include, but are not limited to, any one or more of transistors, diodes, resistors, capacitors, inductors, and memory cells, among others. The circuit elements 230, 234 are interconnect to each other and to the contact pads 110 disposed on the active side 108 of the die body 118 by the routing 232. The routing 232 generally includes conductive lines and via configured to carrier ground, power or data signals.

As discussed above, the circuitry 112 of the first IC die 102 has a first arranged that is a mirror image of a second arrangement comprising the circuitry 114 of the second IC die 104. For example, the location of the contact pads 110, circuit elements 220, 224 and the routing 222 of the first IC die 102 is in the mirror image of the location of the contact pads 110, circuit elements 230, 234 and routings 232 of the second IC die 104. Further, the location of the TSVs 210 within the substrate 204 of the first IC die 102 is in the mirror image of the location of the TSVs 210 within the substrate 204 of the second IC die 104.

Thus, when the first IC die 102 is flipped such that the active side 106 of the first IC die 102 is disposed against the active side 108 of the second IC die 104, the contact pads 110 of the IC dies 102, 104 are aligned to facilitate mechanical and electrical connections either through solderless hybrid bonding or via solder connections of the contact pads 110. Additionally, as the TSVs 210 are disposed in mirror image locations, the TSVs 210 exposed on the back sides 206, 208 of the IC dies 102, 104 may also be mated to interconnect the functional circuitries 112, 114.

The use of IC dies 102, 104 having circuitry 112, 114 formed in mirror images allow for a single mask set to be developed and qualified for the first IC die 102 without separate time and costs for developing and qualifying a wholly new second mask set for the second IC die 104. Particularly, using a mirror image to create a new mask set from the previously designed and qualified mask set ensures that the second IC die 104, fabricated using the mirrored mask set, will have the same functionality, performance and reliability as the first IC die 102 without the significant extra cost and time needed to developing different second mask set for the second IC die 104.

FIG. 3 is a block diagram of a method 300 for fabricating an integrated circuit device that includes the IC dies 102, 104 illustrated in FIG. 1, or other similar mirror imaged IC dies. The various stages of fabrication of the integrated circuit device fabricated according to the method 300 of FIG. 3 are schematically illustrated in FIGS. 4A through 4G.

The method 300 begins at operation 302 in which a first IC die 102 and a second IC die 104 having mirrored circuitry 112, 114 are flipped so that the active sides 106, 108 face each other, as illustrated in FIG. 4A. At operation 304, the IC dies 102, 104 are mounted together such that the contact pads 110 on the active sides 106, 108 of each die body 116, 118 are electrically connected, as shown in FIG. 4B. The IC dies 102, 104 may be mounted together utilizing solder connections, such as microbumps, with hybrid connections, or by other suitable technique, to form a full body, active on active (AoA) IC die stack 402 that include an active on active (AoA) interface 410 defined between mating active sides 106, 108 of the IC dies 102, 104. In the embodiment depicted in FIG. 4B, the AoA interface 410 utilizes a hybrid connecter 412 comprised of metal circuit connection material disposed in a dielectric sheet to couple the contact pads 110 of the IC dies 102, 104 shown in FIG. 4B.

At operation 306, the second IC die 104 is thinned, as illustrated in FIG. 4C. For example, a portion of the back side 208 of the second IC die 104 is removed as shown such that the back side 208 has a new thinned surface 406, resulting in a reduced thickness of the die body 118. The die body 118 may be thinned by grinding, etching, chemical mechanical planarization or other suitable technique. In one example, the die body 118 is thinned by grinding the back side 208 to yield a thickness defined between the thinned surface 406 and the active side 108 of, but not limited to, about 50 µm to about 700 µm. As the second IC die 104 is secured to the first IC die 102 during thinning, no carriers are needed at operation 306, thus saving time and expense. Operation 306 converts the full body, AoA IC die stack 402 to a thinned AoA IC die stack 404.

At operation 308, the thinned AoA IC die stack 404 is aligned for stacking with a flipped second thinned AoA IC die stack 404. As illustrated in FIG. 4D, the second thinned AoA IC die stack 404 has an orientation that is inverted such that the thinned surface 406 of one thinned AoA IC die stack 404 is facing the thinned surface 406 of the other thinned AoA IC die stack 404.

At operation 310, the two thinned AoA IC die stacks 404 are mounted together such that the ends of the TSVs 210, shown in FIG. 2 exposed on the thinned side 406 (formerly the back side 208 prior to thinning), are electrically connected, as shown in FIG. 4E, enabling the circuitries of the die stacks 404 to communicate. The facing IC dies 104, 104 of the thinned AoA IC die stacks 404 may be mounted together utilizing solder connections, such as microbumps, with hybrid connections, or by other suitable technique, to form a full double, AoA IC die stack 408. In the embodiment depicted in FIG. 4E, hybrid connecter 412, such as described above comprised of metal circuit connection material disposed in a dielectric sheet, is utilized to couple the exposed TSVs 210 of the adjacent IC dies 104, 104.

At operation 312, the full double, AoA IC die stack 408 is thinned to form a thinned double AoA IC die stack 440, as illustrated in FIG. 4F. For example, a portion of the back side 206 of at least one of the first IC die 102 is removed such that the back side 206 has a new thinned surface 414, resulting in a reduced thickness of the die body 116. The die body 116 may be thinned as described above, and in one example, is thinned by grinding. Although the top die 102 of the thinned double AoA IC die stack 440 is shown as thinned in FIG. 4F, the bottom die 102 of the thinned double AoA IC die stack 440 may alternatively or additionally be thinned using techniques as described above. As the full double, AoA IC die stack 408 provides a secure anchor for the first IC die 102 during thinning, no carriers are needed at operation 312, thus saving time and expense during fabrication of the thinned double AoA IC die stack 440.

Figure 4G:
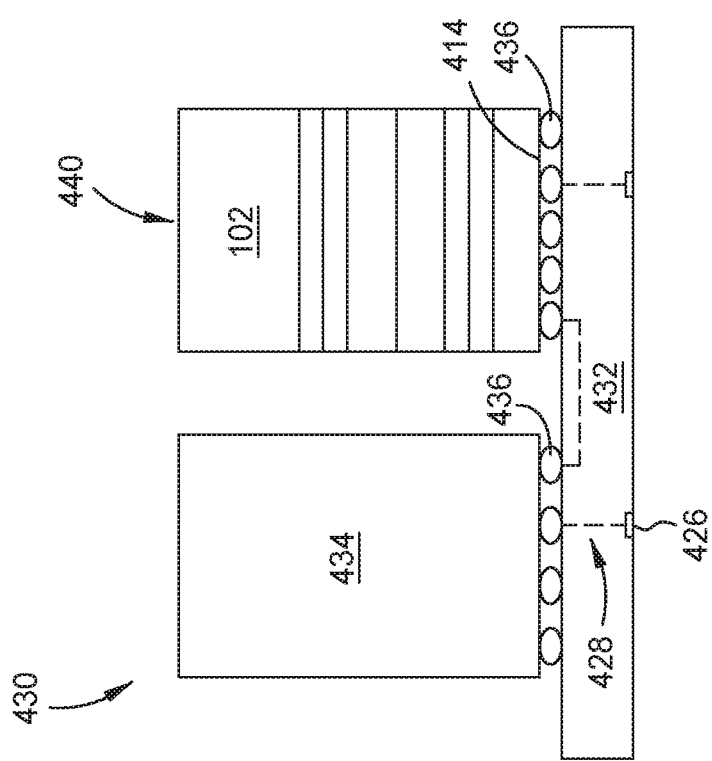

At operation 314, the thinned double AoA IC die stack 440 is utilized to form a chip package assembly 430. The chip package assembly 430 includes a package substrate 432 and may optionally include one or more additional IC dies 434. Circuitry of the thinned double AoA IC die stack 440 is mechanically and electrically connected to the package substrate 432 via solder connections 436 or other suitable packaging connection. The optional additional IC die 434 is also mechanically and electrically connected to the package substrate 432 via solder connections 436 or other suitable packaging connection. The solder connections 436 enable the IC die 434 and the thinned double AoA IC die stack 440 to communicate with each other and with contact pads 426 exposed on the opposite side of the package substrate 432 through routings 428 formed in and/or on the package substrate 432. Although one additional IC die 434 is shown in FIG. 4G, one or more additional IC dies may be stacked on and/or next to the IC die 434. The IC die 434 utilized in the chip package assembly 430 may be configured as, but are not limited to, programmable logic devices, such as field programmable gate arrays (FPGA), application-specific integrated circuit (ASIC), memory devices, such as high band-width memory (HBM), optical devices, optical devices such as photo-detectors, lasers, optical sources, and processors or other IC memory or logic structures. In the example depicted FIG. 4G, the IC die 434 is configured as a logic die, while the thinned double AoA IC die stack 440 is configured as a memory stack, such that the chip package assembly 430 functions as a high band-width memory (HBM) device. The IC die 434 may also be configured identical to one of the IC dies 102, 104 described above.

Figure 5:
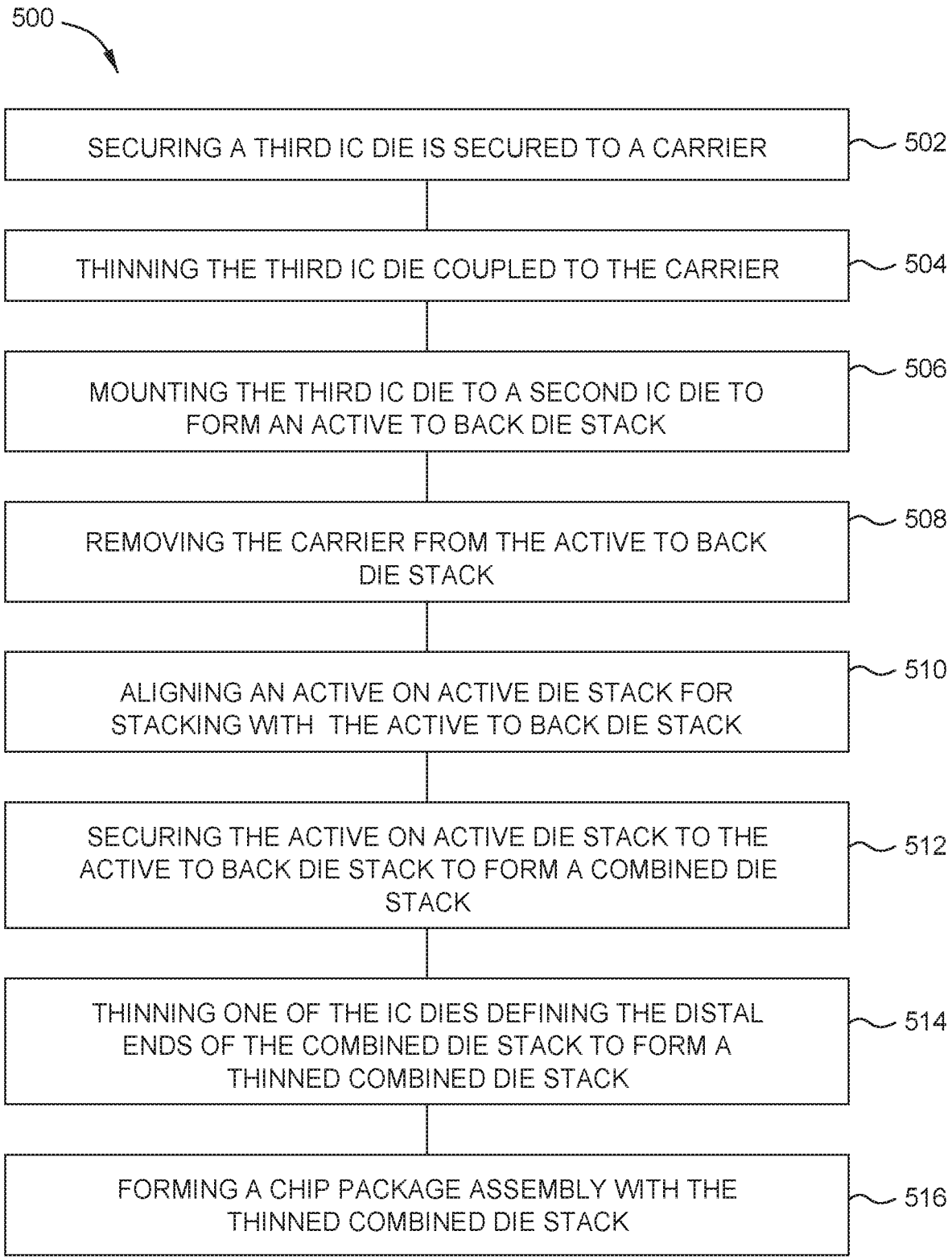
FIG. 5 is a block diagram of a method for fabricating an integrated circuit device that includes the IC dies illustrated in FIG. 1, among others.

FIG. 5 is a block diagram of another method 500 for fabricating an integrated circuit device that includes the IC dies 102, 104 illustrated in FIG. 1, among others. The various stages of fabrication of the integrated circuit device fabricated according to the method 500 of FIG. 5 are schematically illustrated in FIGS. 6A-6H.

The method 500 begins at operation 502 in which a third IC die 660 is secured to a carrier 602, as shown in FIG. 6A. The third IC die 660 is named as such to maintain the prior convention of the first and second IC dies 102, 104 with mirrored circuitry, which will be introduced later in the method 500. The third IC die 660 generally includes a die body having an active region 202 disposed on a substrate 204. The third IC die 660 may be configured as any of the IC dies 102, 104, 434 described above, or as otherwise desired. The die body includes an active side 662 and a back side 664. The active side 662 of the third IC die 660 is releasably coupled to the carrier 602 by a chip attached film or other releasable adhesive.

At operation 504, the third IC die 660 is thinned, as illustrated in FIG. 6B. For example, a portion of the back side 664 of the third IC die 660 is removed as shown such that the back side 664 has a new thinned surface 606, resulting in a reduced thickness of the die body. The die body of the third IC die 660 may be thinned using any of the techniques discussed above, or other suitable technique.

At operation 506, the third IC die 660 is mounted to a second IC die 104, as shown in FIG. 6C. The IC dies 660, 104 may be mounted together utilizing solder connections, such as microbumps, with hybrid connections, or by other suitable technique. In the example depicted in FIG. 6C, the thinned surface 606 of the third IC die 660 is mounted to the active side 108 of the second IC die 104 to form an active to back die stack 610, as later shown in FIG. 6D. At operation 508, the carrier 602 is removed from the active to back die stack 610, also as shown in FIG. 6D.

At operation 510, a thinned AoA IC die stack 404 is aligned for stacking with the active to back die stack 610, as illustrated in FIG. 6E. The thinned AoA IC die stack 404 may be fabricated as described above, or via another suitable technique. As illustrated in FIG. 6E, the thinned AoA IC die stack 404 has an orientation that is inverted such that the thinned surface 406 of the thinned AoA IC die stack 404 is facing the active side 662 of the third IC die 660 of the active to back die stack 610.

At operation 512, the thinned AoA IC die stack 404 secured to the active to back die stack 610, as illustrated in FIG. 6F, to form an active to back, AoA IC die stack 612 that includes an active on active (AoA) interface 410 defined between mating active sides 106, 108 of the IC dies 102, 104.

At operation 514, one of the IC dies 102, 104 defining the distal ends of the active to back, AoA IC die stack 612 is thinned, as illustrated in FIG. 6G, to form a thinned, active to back, AoA IC die stack 640. For example, a portion of the back side 206 of the first IC die 102 is removed as shown such that the back side 206 has a new thinned surface 414, resulting in a reduced thickness of the die body 116. The die body 116 may be thinned as described above, or by another suitable technique. As the first IC die 102 is secured to the active to back, AoA IC die stack 612 during thinning, no carriers are needed at operation 514, thus saving time and expense. The second IC die may also or alternatively be thinned. Operation 516 converts the active to back, AoA IC die stack 612 to the thinned, active to back, AoA IC die stack 640.

Figure 6H:
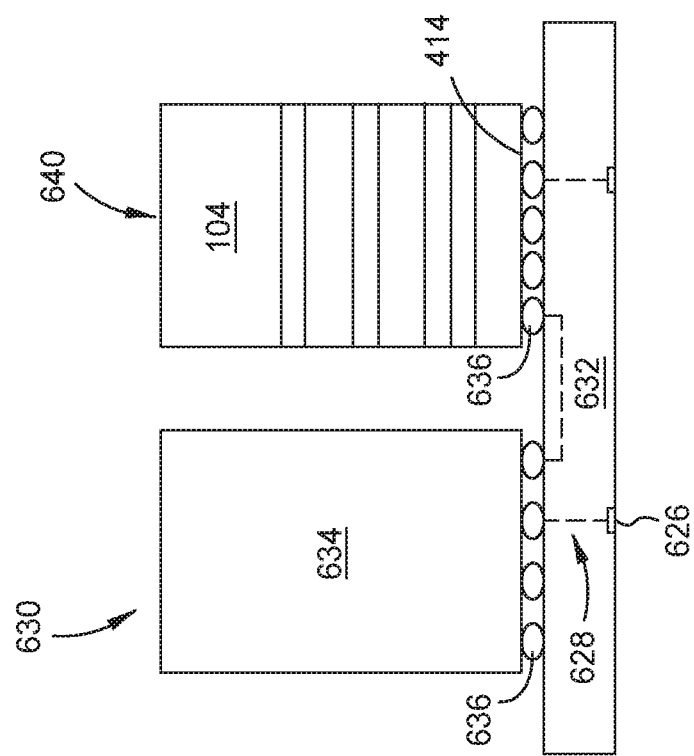

At operation 516, the thinned, active to back, AoA IC die stack 640 is utilized to form a chip package assembly 630, shown in FIG. 6H. The chip package assembly 630 includes a package substrate 632 and may optionally include one or more additional IC dies 634. Circuitry of the thinned, active to back, AoA IC die stack 640 is mechanically and electrically connected to the package substrate 632 via solder connections 636 or other suitable packaging connection. The optional additional IC die 634 is also mechanically and electrically connected to the package substrate 632 via solder connections 636 or other suitable packaging connection. The solder connections 636 enable the IC die 634 and the thinned, active to back, AoA IC die stack 640 to communicate with each other and with contact pads 626 exposed on the opposite side of the package substrate 632 through routings 628 formed in and/or on the package substrate 632. Although one additional IC die 634 is shown in FIG. 6H, one or more additional IC dies may be stacked on and/or next to the IC die 634. The IC die 634 utilized in the chip package assembly 630 may be configured as described above with reference to the IC die 434. In the example depicted FIG. 6H, the IC die 634 is configured as a logic die, while the thinned, active to back, AoA IC die stack 640 is configured as a memory stack, such that the chip package assembly 630 functions as a high band-width memory (HBM) device.

FIGS. 7-9 are schematic side views of various alternative examples of integrated circuit devices that include the IC dies 102, 104 of FIG. 1, among others. Referring first to an integrated circuit device 700 illustrated in FIG. 7, the integrated circuit device 700 includes a thinned double AoA IC die stack 440 and at least one additional, or third, IC die 702. The third IC die 702 may be configured identical to the IC die 434 described above. The third IC die 702 includes a die body having an active region 202 disposed on a substrate 204. An active side 704 of the third IC die 702 is electrically and mechanically coupled to the thinned surface 414 of the first IC 102 disposed at the distal end of the thinned double AoA IC die stack 440. The third IC die 702 may be mounted to the thinned double AoA IC die stack 440 by solder, hybrid or other suitable connections. One or both of the substrate 204 of the third IC die 702 and/or the substrate 204 of the first IC 102 disposed at the opposite end of the thinned double AoA IC die stack 440 may be thinned as illustrated by the phantom lines 706. The integrated circuit device 700 may be utilized in a chip package assembly, such as for example, the chip package assembly 430 illustrated in FIG. 4G, with the integrated circuit device 700 taking the place of thinned double AoA IC die stack 440.

FIG. 8 is another schematic side view of an integrated circuit device 800. The integrated circuit device 800 includes a thinned double AoA IC die stack 440 and at least two additional IC dies. In the example depicted in FIG. 8, a thinned AoA IC die stack 404 containing IC dies 102, 104 is shown coupled to thinned double AoA IC die stack 440. The stacks 404, 440 may be configured described above, except in that the first IC die 102 is thinned rather than the second IC die 104 in the example of FIG. 8. A thinned surface 406 of the thinned AoA IC die stack 404 is electrically and mechanically coupled to a thinned surface 414 of the first IC 102 disposed at the distal end of the thinned double AoA IC die stack 440. The thinned surface 406 may be mounted to the thinned surface 414 by solder, hybrid or other suitable connections. One or both of the substrates 204 exposed at the distal ends of the integrated circuit device 800 may be thinned as illustrated by the phantom lines 808. The integrated circuit device 800 may be utilized in a chip package assembly, such as for example, the chip package assembly 430 illustrated in FIG. 4G, with the integrated circuit device 800 taking the place of thinned double AoA IC die stack 440.

FIG. 9 is another schematic side view of an integrated circuit device 900. The integrated circuit device 900 includes two thinned AoA IC die stacks 404 sandwiching at an additional IC die 802. Although only one additional IC die 802 is shown between the thinned AoA IC die stacks 404, more than one additional IC die 802 may be utilized. The IC die 802 may be configured identical to the IC die 434 described above.

In the example depicted in FIG. 9, a thinned surface 406 of one of the thinned AoA IC die stack 404 is shown coupled an active side 804 of the IC die 802, while a thinned surface 406 of the other thinned AoA IC die stack 404 is shown coupled a back side 806 of the IC die 802. The integrated circuit device 900 may be utilized in a chip package assembly, such as for example, the chip package assembly 430 illustrated in FIG. 4G, with the integrated circuit device 900 taking the place of thinned double AoA IC die stack 440. Although all the IC dies of the integrated circuit device 900 are shown in a thinned configuration, one or more of the IC dies of the integrated circuit device 900 may have a full body.

Thus, integrated circuit devices and techniques for manufacturing the same have been described above that leverage two or more pairs of stacked integrated circuit dies that include circuitry arranged in mirror images to reduce the complexity of manufacturing. The mirror image IC dies allow for a single mask set to be developed and qualified for one die, while the second mask set is made in the mirrored image without the send for separate design and qualification, thus providing a significant savings in development time and cost. Furthermore, the pair of mirrored, stacked integrated circuit dies allows fabrication of a die stack of four of more IC dies to be produced with a reduced number of carriers needed during fabrication. Thus, the cost and time needed to fabrication the integrated circuit device is further reduced. Accordingly, robust integrated circuit devices are realized that have significant cost and time to production advantages over conventional fabrication techniques.

It is noted that the use of mirror dies coupled across their active sides beneficially allows the advantages described above to be realized even if utilized in a IC die stack having only two mirrored IC dies, or even more than four mirrored IC dies.

Furthermore, the fabrication sequence described above that enables the elimination of one or more carrier attach and detach operations may also be used to advantage without the use of IC dies having functional circuitry arranged in mirror images.

While the foregoing is directed to embodiments of the present invention, other and further embodiments of the invention may be devised without departing from the basic scope thereof, and the scope thereof is determined by the claims that follow.

What is claimed is:

1. An integrated circuit device comprising:
an integrated circuit (IC) die stack comprising:
a first IC die having a first die body, the first die body having an active side, a back side, and a first arrangement of integrated circuitry is disposed;
a second IC die having a second die body, the second die body having an active side, a back side and a second arrangement of integrated circuitry, the active side of the first IC die mounted to the active side of the second IC die, the second arrangement of integrated circuitry is a mirror image of the first arrangement of integrated circuitry;
a third IC die having a third die body, the third die body having an active side, a back side, and a third arrangement of integrated circuitry; and
a fourth IC die having a fourth die body, the fourth die body having an active side, a back side, and a fourth arrangement of integrated circuitry, the active side of the third IC die mounted to the active side of the fourth IC die, the fourth arrangement of integrated circuitry is a mirror image of the third arrangement of integrated circuitry.

2. The integrated circuit device of claim 1 further comprising:
a fifth IC die having fifth die body, the fifth die body having an active side, a back side, and a fifth arrangement of integrated circuitry, the back side of the fifth IC die mounted to the back side of the fourth IC die.

3. The integrated circuit device of claim 2 further comprising:
a sixth IC die having fifth die body, the sixth die body having an active side, a back side, and a sixth arrangement of integrated circuitry, the active side of the sixth IC die mounted to the active side of the fifth IC die.

4. The integrated circuit device of claim 1, wherein the second arrangement of integrated circuitry is a mirror image of the third or fourth arrangement of integrated circuitry.

5. The integrated circuit device of claim 1 further comprising:
a fifth IC die having fifth die body, the fifth die body having an active side, a back side, and a fifth arrangement of integrated circuitry, the fifth IC die disposed in the IC die stack between the second and third IC dies.

6. The integrated circuit device of claim 1, wherein the first, second, third and fourth IC dies of the IC die stack are memory dies.

7. The integrated circuit device of claim 1 further comprising:
a package substrate having the IC die stack mounted thereto; and
a logic die mounted to the package substrate and configured to communicate with the IC dies of the IC die stack through routings disposed at least one of on or in the package substrate.

8. The integrated circuit device of claim 7, wherein one or more of the first, second, third and fourth IC dies are thinned.

9. The integrated circuit device of claim 7, wherein the die stack further comprise:
a fifth IC die having fifth die body, the fifth die body having an active side, a back side, and a fifth arrangement of integrated circuitry, wherein one of the third IC die or the fifth IC die is mounted between the second IC die and the fourth IC die.

10. An integrated circuit device comprising:
an integrated circuit (IC) die stack comprising:
a first IC die having a first die body, the first die body having an active side, a back side, and a first arrangement of integrated circuitry;
a second IC die having a second die body, the second die body having an active side, a back side, and a second arrangement of integrated circuitry, the active side of the first IC die mounted to the active side of the second IC die, the second arrangement of integrated circuitry is a mirror image of the first arrangement of integrated circuitry;
a third IC die having a third die body, the third die body having an active side and a back side, the active side of the third die body coupled to the back side of the second IC die; and
a fourth IC die having a fourth die body, the fourth die body having an active side and a back side, the active side of the fourth die body coupled to the back side of the third IC die.

11. The integrated circuit device of claim 10 further comprising:
a package substrate having the die stack mounted thereto; and
a logic die mounted to the package substrate and configured to communicate with the IC dies of the die stack through routings disposed at least one of on or in the package substrate.

12. A method for fabricating an integrated circuit device, the method comprising:
mounting an active side of a first integrated circuit (IC) die to an active side of a second IC die, the first and second IC dies having an arrangement of integrated circuitry that are mirror images of each other; and
mounting a third IC die to a back side of the second IC die.

13. The method of claim 12 further comprising:
mounting an active side of a fourth IC die to a back side of the third IC die, the third and fourth IC dies having an arrangement of integrated circuitry that are mirror images.

14. The method of claim 13 further comprising:
mounting an active side of a fifth IC die to an active side of a fourth IC die, the fifth and fourth IC dies having an arrangement of integrated circuitry that are mirror images.

15. The method of claim 12 further comprising:
mounting an active side of the third IC die to an active side of a fourth IC die, the third and fourth IC dies having an arrangement of integrated circuitry that are mirror images.

16. The method of claim 15, wherein mounting the third IC die to the back side of the second IC die further comprises:
mounting the first IC die to the second IC die prior to mounting the third IC die to the second IC die.

17. The method of claim 16, wherein mounting the third IC die to the back side of the second IC die further comprises:
   mounting the third IC die to the fourth IC die prior to mounting the third IC die to the second IC die.

18. The method of claim 17 further comprising:
   thinning the first IC die after the first IC die has been mounted to the second IC die.

19. The method of claim 17 further comprising:
   thinning at least one of the first IC die and the fourth IC die after the second IC die has been mounted to the third IC die.

20. The method of claim 15, wherein the arrangement of integrated circuitry of the first IC die or second IC die is a mirror image to an arrangement of integrated circuitry of the third IC die.

\* \* \* \* \*